United States Patent
Rivkin et al.

(10) Patent No.: US 7,176,140 B1
(45) Date of Patent: Feb. 13, 2007

(54) ADHESION PROMOTION FOR ETCH BY-PRODUCTS

(75) Inventors: Michael Rivkin, Sunnyvale, CA (US); James A Fair, Mountain View, CA (US)

(73) Assignee: Novellus Systems, Inc., San Jose, CA (US)

( * ) Notice: Subject to any disclaimer, the term of this patent is extended or adjusted under 35 U.S.C. 154(b) by 236 days.

(21) Appl. No.: 10/888,461

(22) Filed: Jul. 9, 2004

(51) Int. Cl.
*H01L 21/302* (2006.01)
*H01L 21/3065* (2006.01)

(52) U.S. Cl. .......................... 438/706; 438/710; 134/1; 134/1.2

(58) Field of Classification Search ................ 438/706, 438/710; 134/1, 1.1, 1.2
See application file for complete search history.

(56) References Cited

U.S. PATENT DOCUMENTS

| | | | | |
|---|---|---|---|---|
| 5,236,868 A | * | 8/1993 | Nulman ...................... 438/653 |
| 5,988,187 A | * | 11/1999 | Trussell et al. ............. 134/22.1 |
| 2003/0013314 A1 | * | 1/2003 | Ying et al. .................... 438/710 |
| 2003/0183244 A1 | * | 10/2003 | Rossman ..................... 134/1.1 |

* cited by examiner

*Primary Examiner*—Nadine Norton
*Assistant Examiner*—Lynette T. Umez-Eronini
(74) *Attorney, Agent, or Firm*—DeLio & Peterson, LLC; Kelly M. Nowak

(57) ABSTRACT

Methods and apparatus for cleaning a semiconductor substrate that significantly reduce the number of particles falling onto the substrate during cleaning by coating all interior surfaces within a processing chamber with an adhesion film that has an increased sticking coefficient for any subsequently arriving etched species to promote a continuous film growth and improve adhesion of such etched species. Due to its increased sticking coefficient, this adhesion film reduces surface mobility of any arriving by-products to enable the growth of the continuous film of etched species. The continuous film of etched species adheres firmly to the adhesion film such that the etched species are prevented from flaking off and falling onto the substrate being cleaned. The methods and apparatus may clean a plurality of semiconductor substrates, whereby a plurality of adhesion films are sequentially deposited over a plurality of continuous film growths of removed materials for cleaning the substrates.

19 Claims, 5 Drawing Sheets

ADHESION PROMOTION FOR ETCH BY-PRODUCTS

BACKGROUND OF THE INVENTION

1. Field of the Invention

The present invention relates generally to the cleaning of residues and by-products from substrate surfaces and, in particular, to removing residues and by-products from electronic component substrates, such as integrated circuits and semiconductor wafers, and adhering such removed residues and by-products to interior surfaces within a processing chamber.

2. Description of Related Art

The fabrication of electronic components such as integrated circuit semiconductors is very exacting and complex and requires a number of processing steps requiring extreme precision to form the desired circuit pattern on the component substrate. Typical semiconductor devices now have circuit line widths typically less than 0.5 micron with close spacing of the lines and via interconnections. Contamination of the semiconductor substrate in the form of particles on the substrate surface may cause short circuits, open circuits and other defects, which can cause the component to fail and/or adversely affect the performance of the component. For example, an individual particle as small as 100 angstroms in diameter can result in a defect in a modern microcircuit electronic component.

Cleaning the surface of the semiconductor substrate is therefore a critical step in integrated circuit fabrication. There are currently numerous methods used to clean substrate surfaces in the electronic industry. Water, solvents or chemical cleaning agents or gases are often used to remove contaminate particles and films from the surfaces. For example, gas jet cleaning and liquid spray cleaning are used to clean relatively large particles from silicon substrates.

Cleaning is also used to remove native metal oxides when clean virgin surface is required, which is the case for preclean prior to conductive materials deposition on top of other conductive layers, such as for physical or chemical vapor deposition of electrically conductive materials.

Sputtering is another technique for cleaning both large and small particles from substrate surfaces. Sputter cleaning of a substrate involves bombardment of the surface with argon or other types of gas ions for the removal of oxide and/or nitride films, and thereby improve the adhesion of subsequently deposited material layers to the substrate surface. During the sputter cleaning process, by-products, residues and particles are removed from the substrate surface and deflected towards the interior components of the sputter chamber, such as shields, as well as towards the interior sputtering chamber walls. These by-products, residues and particles adhere to both the interior sputtering chamber components and the interior chamber walls.

As these by-products, residues and particles are sputtered, they adhere to the chamber components and interior chamber surfaces in a non-uniform manner. Due to this non-uniform nature of adherence, the deposited by-products, residues and particles have relatively poor adhesion to the chamber walls and components since the areas of contact and bonding between deposition and the chamber walls and components are small. As sputtering continues through a number of wafers, more of these by-products, residues and particles are deposited on the chamber components and interior surfaces. As the thickness of deposition increases, the deposited by-products, residues and/or particle nodules grow and start touching each other. However, rather than forming a continuous coating or film, upon contact of these by-products, residues and/or particle nodules with each other, the nodules crack and break-off due to the low ductility, falling onto the semiconductor wafer being processed. It is these particles falling onto the semiconductor surfaces that damage the semiconductor and ultimately lead to device failure. One root cause of particle failure is believed to be due to poor adhesion of by-products to the chamber components and interior surfaces due to small areas of contact and bonding.

Prior art has focused on increasing the surface area of the chamber components to improve adhesion. For example, prior art is directed at the use of high surface area coatings on chamber components, such as aluminum arc spray, alumina or zirconia plasma spray, to solve the problem of material delamination from shield substrates in etch modules. However, such practices do not significantly improve material delamination, such that these procedures are not sufficient for practical production and manufacturing purposes.

Wafer contamination continues to be a problem in the electronics and semiconductor fabrication industry. As the industry advances and technology is being developed to form smaller and more complex circuits, a more effective and efficient cleaning method to remove by-product, residue and particulate foreign matter from substrates, and preventing such removed foreign matter from damaging the substrates, is required to produce electronic and semiconductor components.

SUMMARY OF THE INVENTION

Bearing in mind the problems and deficiencies of the prior art, it is therefore an object of the present invention to provide a method and assembly for cleaning residues, by-products, contaminants and/or molecular fragments from semiconductor substrate surfaces.

It is another object of the present invention to provide a method and assembly for preventing residues, by-products, contaminants and/or molecular fragments from damaging any semiconductor substrates being processed within a process chamber.

A further object of the invention is to provide a method and assembly for cleaning semiconductor substrate surfaces that is easy, efficient, effective, inexpensive and reliable.

Another object of the invention is to provide electronic components made using electronic component substrates cleaned using the method and assembly of the invention.

It is another object of the present invention to provide electronic component substrates including semiconductor substrates that have been cleaned using the method and assembly of the invention.

Still other objects and advantages of the invention will in part be obvious and will in part be apparent from the specification.

The above and other objects, which will be apparent to those skilled in art, are achieved in the present invention, which is directed to in a first aspect a method of cleaning a semiconductor substrate by providing a first target wafer within a processing chamber and coating all interior surfaces within the processing chamber with a first adhesion film of a material of the first target wafer. The first target wafer is then removed, and at least one semiconductor substrate is provided within the processing chamber. A surface of the semiconductor substrate is cleaned whereby removed particles from the semiconductor substrate adhere to the first adhesion film on the interior surfaces within the processing chamber to form a continuous film of the removed particles.

The first target wafer may be Ti, Al, Ta or Ni. Further, the first target wafer may be composed of either a solid, single material or a wafer coated with a material, whereby such materials have a sufficient sticking coefficient for adherence of subsequently removed materials in order to promote the continuous film growth and improve adhesion of the film. Preferably, the first target wafer has a thickness ranging from about 0.5 mm to about 10 mm.

Preferably, the first target wafer is processed within the processing chamber such that the material of the first target wafer is removed from the first target wafer. This removed material is then directed at and adheres to all the interior surfaces within the processing chamber to from the first adhesion film. In so doing, the first target wafer may be sputtered or reactively ion etched, whereby about 25% to about 35% of this removed material adheres to the interior surfaces to form the first adhesion film. The first adhesion film preferably has a thickness ranging from about 50 Å to about 4,000 Å. Optionally, a plurality of semiconductor substrates may be processed within the processing chamber for cleaning surfaces thereof, whereby removed particles from the plurality of semiconductor substrates adhere to the first adhesion film.

In this first aspect of the invention, the method further includes the steps of removing the cleaned at least one semiconductor substrate, and providing a second target wafer within the processing chamber. The continuous film of the removed particles is then coated with a second adhesion film of a material of the second target wafer. The second target wafer is then removed, and at least another semiconductor substrate is provided within the processing chamber. This semiconductor substrate is then cleaned whereby removed particles from the other semiconductor substrate adhere to the second adhesion film to form a second continuous film of removed particles. These steps may be repeated a plurality of times for forming a plurality of adhesion films and continuous films of removed particles for cleaning a plurality of semiconductor substrates, whereby the second target wafer may comprise either the first target wafer or a new target wafer.

In another aspect, the invention is directed to a method of cleaning a semiconductor substrate by providing a semiconductor processing chamber having a pedestal and positioning a target wafer on the pedestal. The target wafer is etched such that a material of the target wafer is removed from the target wafer and coats all interior surfaces within the processing chamber with an adhesion film of the material having a thickness ranging from about 50 Å to about 4,000 Å. The target wafer is then removed, and a plurality of semiconductor substrates are positioned on the pedestal within the processing chamber. These plurality of semiconductor substrates are then cleaned whereby matter removed from the plurality of semiconductor substrates are directed at and adhere to the adhesion film to form a continuous film of the removed matter.

In still another aspect, the invention is directed to an apparatus for cleaning a semiconductor substrate. The apparatus includes a processing chamber having a plurality of interior components, and an adhesion film coating all interior surfaces within the processing chamber including surfaces of the interior components. A critical feature of this adhesion film is that it has a sufficient sticking coefficient for adherence of materials removed from at least one semiconductor substrate for cleaning the semiconductor substrate in order to promote a continuous film growth of the removed materials and improve adhesion of the film on the adhesion film. Optionally, the apparatus may include a plurality of adhesion films sequentially deposited over a plurality of continuous film growths of the removed materials for cleaning a plurality semiconductor substrates.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED
EMBODIMENT(S)

In describing the preferred embodiment of the present invention, reference will be made herein to FIGS. 1–6 of the drawings in which like numerals refer to like features of the invention.

The present invention significantly reduces the number of particles that deposit on a wafer or semiconductor substrate during the cleaning or precleaning stage by coating all interior surfaces within the processing chamber with a continuous material that increases the sticking coefficient of any arriving etched species to promote a continuous film growth and improve the adhesion of such etched species. The invention enables accumulation of significantly thicker etched species depositions without an on-wafer particle failure. An advantage of the present invention is that the increased sticking characteristics of the continuous pre-coating and post-coating films of the invention reduce surface mobility of any arriving by-products such that a continuous film growth is promoted. An advantage of the invention is that it is applicable to etched species that form irregularly nucleated films or brittle films and for the films with poor adhesion. Another benefit is that stresses arising from the deposition of the etch byproducts are significantly reduced.

Figure 1:
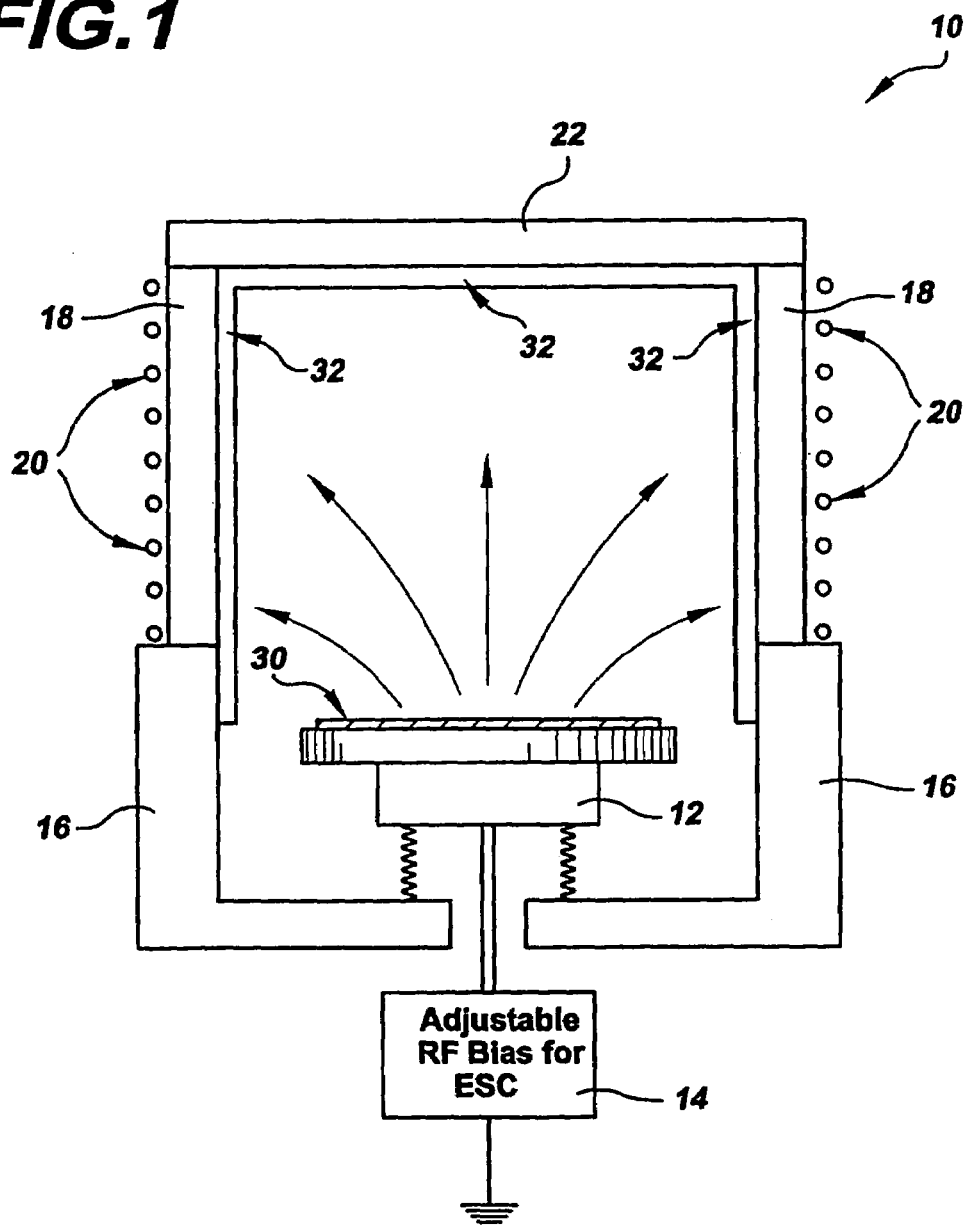
FIG. 1 is a cross sectional view of the invention showing a target wafer residing on a pedestal within a processing chamber, and coating all interior surfaces of the processing chamber with a continuous adhesion film by etching the target wafer.

Referring to FIG. 1, a processing chamber 10 is shown for processing a semiconductor substrate in accordance with the invention. The processing chamber 10 may include a variety of known semiconductor processing chambers including, but not limited to, an etch chamber, sputtering chamber, a physical vapor deposition chamber, chemical vapor deposition chamber and the like. For ease of understanding the invention, the processing chamber 10 includes a pedestal 12 coupled to an adjustable RF bias 14 for etching a semiconductor substrate. Chamber sidewalls surround and enclose the pedestal 12 within the chamber. These sidewalls may include, for example, shields 16, sidewall cylinder 18 and a flat lid 22. A number of coils 20 with the capability of being RF powered may surround the sidewall cylinder 18.

In accordance with the invention, prior to processing a semiconductor substrate within the processing chamber 10, a target wafer 30 is provided within the processing chamber 10 and is positioned and secured on top of the pedestal 12. Alternatively, at least one or a plurality of semiconductor substrates may be processed within the processing chamber 10, and then removed from the processing chamber prior to providing the target wafer 30 within the processing chamber for cleaning any further or additional semiconductor substrates. That is, substrates may be processed within the processing chamber 10 prior to forming a continuous adhesion film 32 of the invention. The target wafer 30 should be sufficiently thick such that it can be handled easily for insertion and removal, to and from, the processing chamber. The target wafer 30 must also have both a sufficient thickness and diameter for etching, such as a thickness ranging from about 0.5 mm to about 10 mm and a diameter similar to that of a typical process wafer diameter, such as 200 mm, 300 mm, and the like.

The target wafer 30 may include a solid disc of a material that has sufficient adhesion capabilities for both its adherence to component surfaces and adhesion of subsequently sputtered materials to the target wafer material itself. An essential feature of the invention is that the material of the target wafer 30 to be sputtered have a sufficient sticking coefficient for adherence to these subsequently sputtered materials in order to promote a film growth and improve the adhesion of the film to enable accumulation of significantly thicker depositions without an on-wafer particle failure. Alternatively, the target wafer may be a disc covered with a material that has the aforementioned sufficient adhesion properties. For example, the material that the target wafer 30 is composed of may include, but is not limited to, Ti, Al, Ta, Ni and the like.

For ease of understanding, the invention is described with reference to the target wafer 30 comprising a solid Ti target wafer or a wafer coated with Ti; however, it should be appreciated that any of the aforementioned materials may be used in accordance with the invention.

Once the Ti target wafer 30 is positioned and secured to the pedestal 12, the target wafer 30 is in-situ sputtered or reactively ion etched in the processing chamber such that the material of the target wafer 30 is released from the target wafer, and is directed at and adheres to, or is redeposited onto, all interior surfaces within the processing chamber. These interior surfaces of the processing chamber may include, for example the interior surfaces of the shields 16, sidewall cylinder 18 and the flat lid 22 residing within the processing chamber 10. As the material of the target wafer 30 is sputtered and adhered to these interior surfaces, a continuous adhesion film 32 of sputtered target wafer material forms on all exposed interior surfaces within the processing chamber. For example, wherein the target wafer is a Ti target wafer, an adhesion film 32 coats all exposed interior surfaces. In so doing, this adhesion film 32 coats all components within the processing chamber 10, including those within line-of-sight of the target wafer 30 and those components within a reached distance of any Ti atoms that bounces off of any line-of-sight component. The highly reactive nature of Ti atoms promotes high strength bonds to all interior surfaces, including the shields, and to the subsequently etched by-products, as well as promotes a continuous film growth due to the reduced by-products mobility on and increased reactivity with the Ti film surface.

During the processing of sputtering the Ti target wafer 30, Ti atoms are sputtered off the Ti target wafer such that about 10% to about 35%, preferably about 25% to about 35%, of these sputtered Ti atoms adhere to the interior chamber surfaces and components to form the adhesion film 32 thereon. In so doing, the target wafer adhesion film 32 is preferably deposited onto all exposed interior component surfaces within the processing chamber 10 to a thickness ranging from about 50 Å to about 4,000 Å, more preferably from about 200 Å to about 1,000 Å. This adhesion film 32 may be uniform in thickness in selected areas, or on selected interior chamber components, onto which the film has been formed, and/or it may vary in thickness in other areas or on other components where the adhesion film 32 has been deposited.

Figure 2:
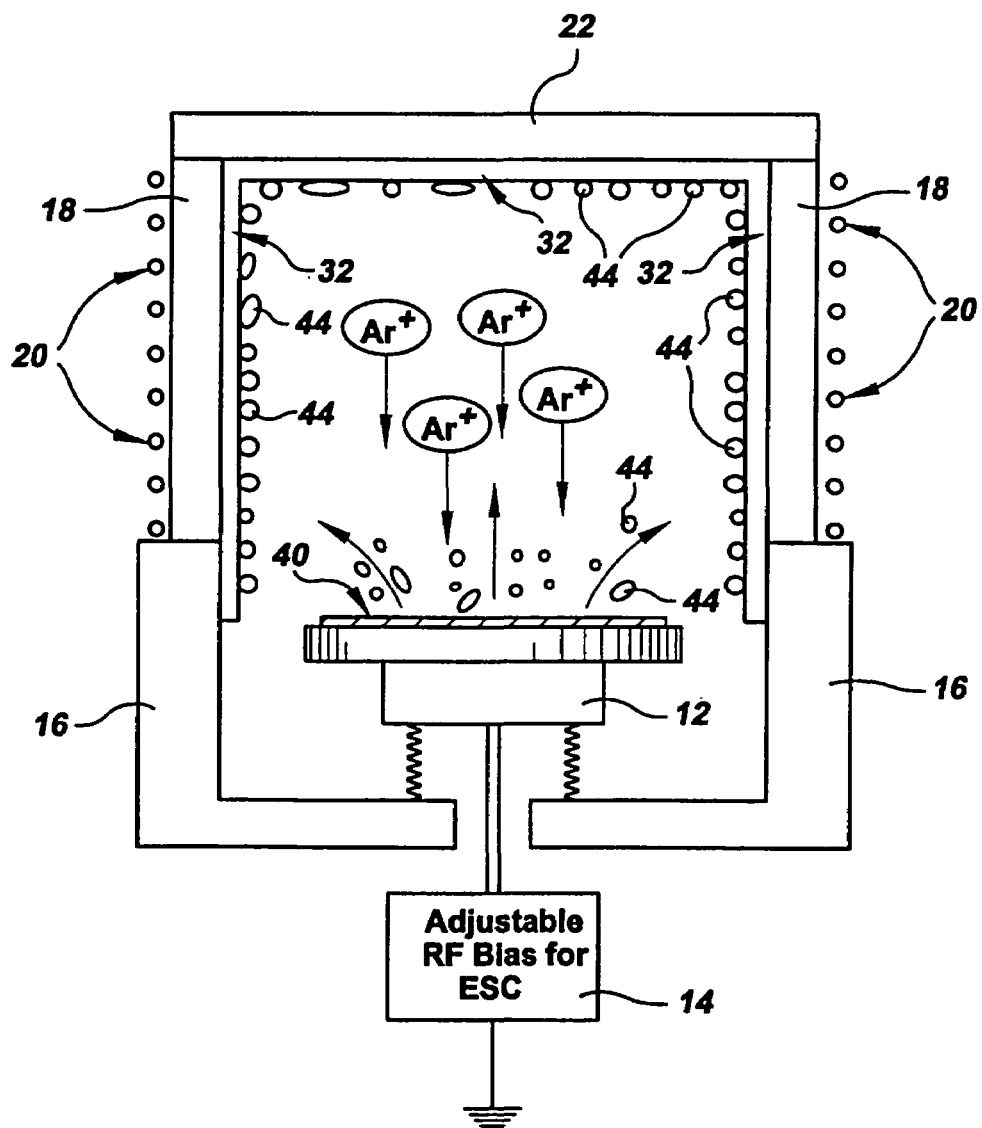
FIG. 2 is a cross sectional view of FIG. 1 showing at least one semiconductor substrate being cleaned within the processing chamber such that matter being removed from the semiconductor substrate surface adheres to the adhesion film.

Referring to FIG. 2, once the target wafer adhesion film 32 coats all exposed interior surfaces to a desired thickness, the Ti target wafer 30 is removed from the processing chamber 10, and a semiconductor substrate 40 provided therein. The semiconductor substrate 40 is positioned and secured to the pedestal 12 for cleaning the entire surface area of the semiconductor substrate 40, such as by etching. In etch cleaning the substrate, a sputtering gas flow is provided within the processing chamber for removing residues, particles, contaminants and/or molecular fragments 44 from the substrate surface. This sputtering gas flow may include, for example, argon, helium, krypton, as well as reactive gas like hydrogen, nitrogen, oxygen and the like.

Upon etching the semiconductor substrate surface, these residues, particles, contaminants and/or molecular fragments 44, which may include chemical residues, photoresist residues, chemical by-products such as oxidation by-products, chemical molecular fragments, copper, copper oxides, silicon oxygen nitride (SiON), tantalum nitride, (TaN), titanium nitride (TiN) and the like, are sputtered off of the substrate surface and are released and dispersed throughout the interior of the processing chamber. In so doing, selected residues, particles, contaminants and/or molecular fragments may be pumped out of the processing chamber. However, others are directed toward the interior surfaces and components within the processing chamber that are coated with the adhesion film 32 of target wafer material and directly contact the adhesion film 32, and upon contact, adhere to the adhesion film, as shown in FIG. 2. As these residues, particles, contaminants and/or molecular fragments 44 adhere to the adhesion film 32, they start to build-up a film on the interior surfaces within the processing chamber. In addition, if long idle time is incurred between processing of wafers or of target wafers, additional layer(s) of adhesion material may be deposited to maintain acceptable on-wafer particle counts for refreshing the adhesion properties of the chamber and shield surfaces.

In accordance with the invention, a plurality of semiconductor substrates may be cleaned as described above, whereby the single, continuous adhesion film 32 has sufficient strength and adherence properties to collect and retain substantially all of the residues, particles and contaminants removed from the plurality of semiconductor substrates. Preferably, from about 1 to about 2,000 semiconductor substrates may be pre-cleaned using a single deposited adhesion film 32. More preferably, from about 50 to about 400 semiconductor substrates may be pre-cleaned using the present invention, most preferably about 100 semiconductor substrates are cleaned.

Figure 3:
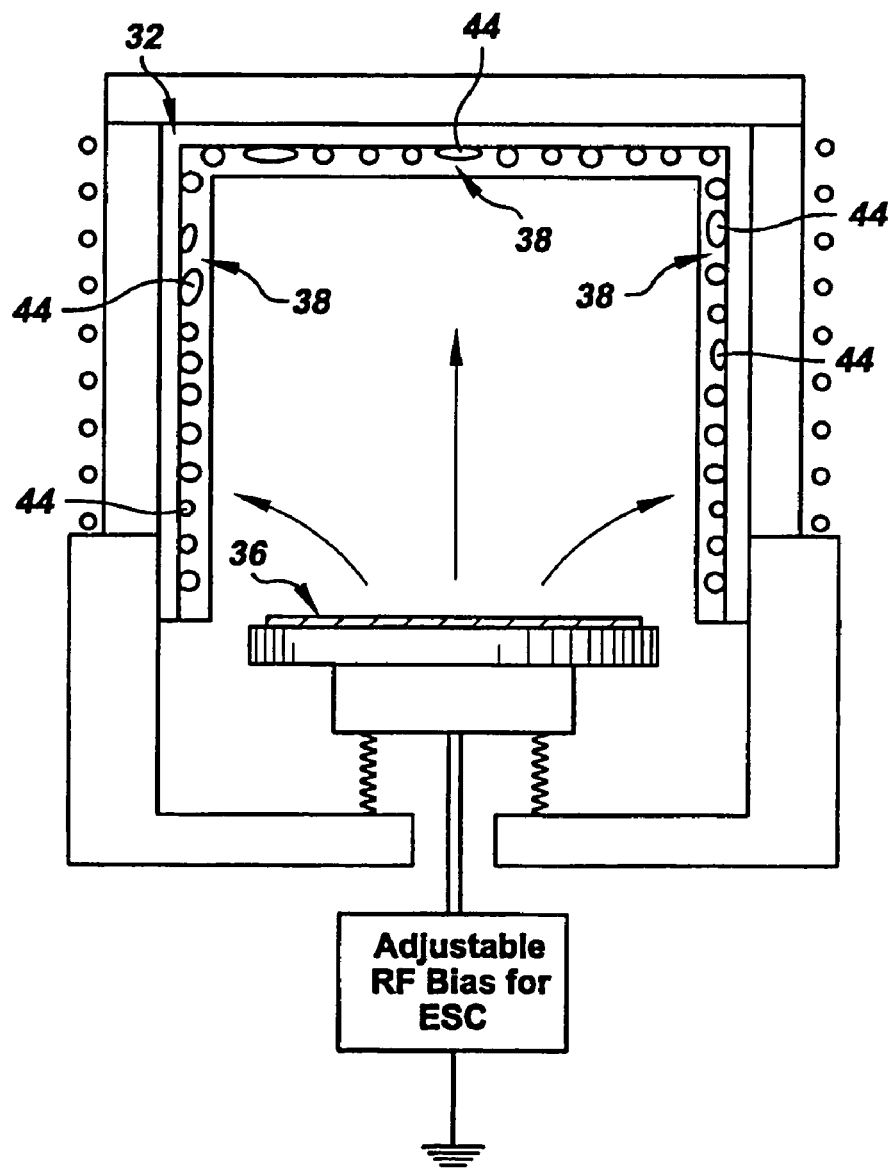
FIG. 3 is a cross sectional view of FIG. 2 showing only a target wafer within the processing chamber, and forming a second continuous adhesion film on all interior surfaces within the processing chamber as well as covering the removed matter that has adhered to the first adhesion film of FIG. 1.

Once the plurality of semiconductor substrates have been cleaned using the single deposited adhesion film 32 of the invention, all semiconductor substrates are removed from the processing chamber 10, and a target wafer 36 is provided within the processing chamber 10 and affixed to the pedestal, as shown in FIG. 3. This target wafer 36 may comprise the original target wafer 30 or alternatively a new target wafer. The target wafer 36 is then etched or sputtered such that target material atoms are removed from the target wafer 36 and deposited onto all interior surfaces within the processing chamber in a thickness at least sufficient to cover the adhered residues, particles and contaminants 44 on the original, single deposited adhesion film 32. Preferably about 10% to about 35% of the sputtered Ti atoms adhere to the interior chamber surfaces and components to form a second continuous adhesion film 38 that covers the adhered residues, particles, contaminants and/or molecular fragments 44 and coats all exposed interior surfaces within the processing chamber.

Upon completion of this second continuous adhesion film 38 that covers both the adhered materials 44 and the first adhesion film 32, the target wafer 36 is removed from the processing chamber and another plurality of semiconductor substrates are provided within the processing chamber for cleaning. Again, from about 1 to about 2,000, more preferably from about 50 to about 400, and most preferably about 100 semiconductor substrates are cleaned whereby residues, particles, contaminants and/or molecular fragments 44 removed from this set of semiconductor substrates adhere to the second continuous adhesion film 38. This process may be repeated a number of times to ensure that a continuous film continues to grow.

Figure 4:
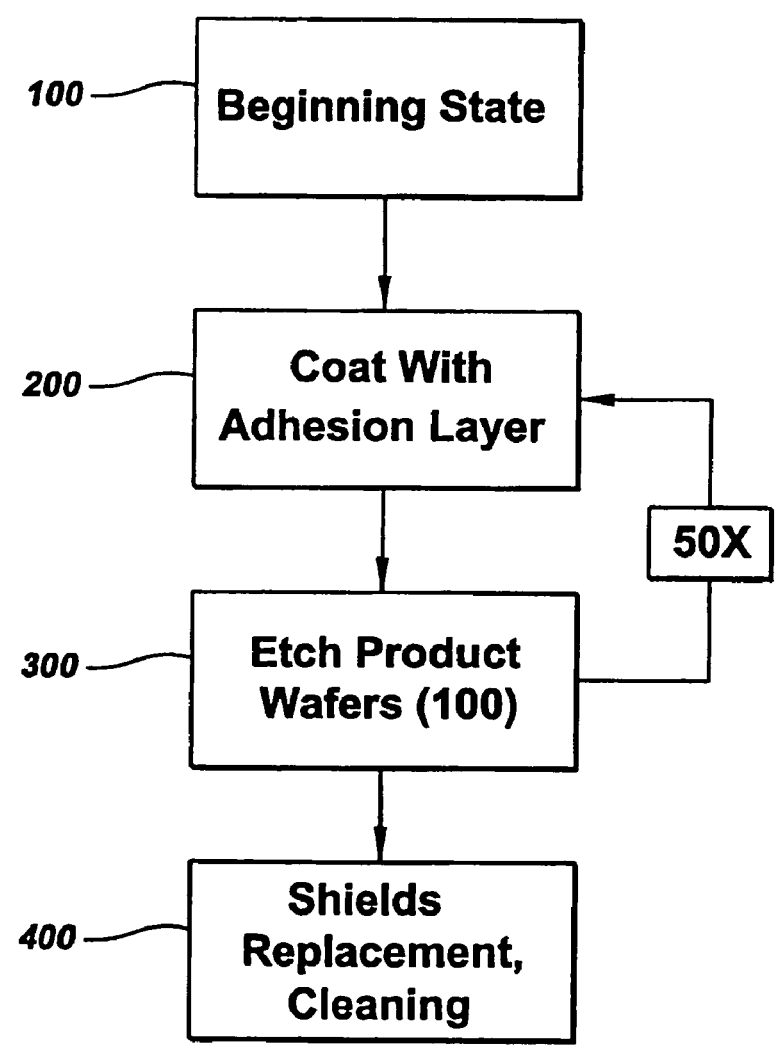
FIG. 4 is a process flow of the processing steps of the present invention.

The process flow of the invention can be seen in FIG. 4. As shown, the process begins by providing a processing chamber (step 100). An in-situ continuous pre-coating adhesion film of a material that increases sticking coefficient of any subsequently arriving etched species to promote a film growth and improve the adhesion of such etched species is then formed on all interior surfaces within the processing chamber by etching or sputtering a target wafer composed of such material (step 200). Once the adhesion film has been deposited, the target wafer is removed and then at least one semiconductor substrate is provided within the processing chamber and etch cleaned such that residues, particles, contaminants and/or molecular fragments are removed there-from and adhere to the adhesion film (step 300). In accordance with the invention, the steps of forming the adhesion films from the target wafer and etch cleaning semiconductor substrates may be repeated a number of times prior to having to replace or clean the interior surfaces within the processing chamber that have been coated with these adhesion films and removed materials from the substrates (step 400). For example, as shown in the process flow of FIG. 4, wherein about 100 semiconductor substrates are etch cleaned using a single deposition of an adherence film, the steps of coating all interior surfaces with the adhesion film (step 200), followed by etch cleaning about 100 wafers at a time (step 300) may be repeated approximately 50 times.

That is, in accordance with the invention an adhesion film is deposited and then about 100 wafers are etch cleaned using such adhesion film, another adhesion film is deposited over the first adhesion film and removed materials and then another 100 wafers are etch cleaned, and so forth, to ensure that a continuous film continues to grow. This process may be repeated about 50 times, or until about 1 mm thickness of the combined layers of adhesion films and removed materials from the substrates has been deposited onto the interior surfaces within the processing chamber. Using this repetitive process of the invention, up to approximately 5,000 wafers or semiconductor substrates may be efficiently and effectively cleaned prior to having to replace or clean the interior surfaces within the processing chamber (step 400), as compared to conventional processes that do coat all interior surfaces within the processing chamber with the adhesion film of the invention, and as such, are only able to process about 500 wafers or semiconductor substrates prior to having to replace or clean the interior components and interior surfaces within the processing chamber. Accordingly, the present invention advantageously provides an order of magnitude improvement over such conventional processes of cleaning semiconductor substrate surfaces.

Figure 5:
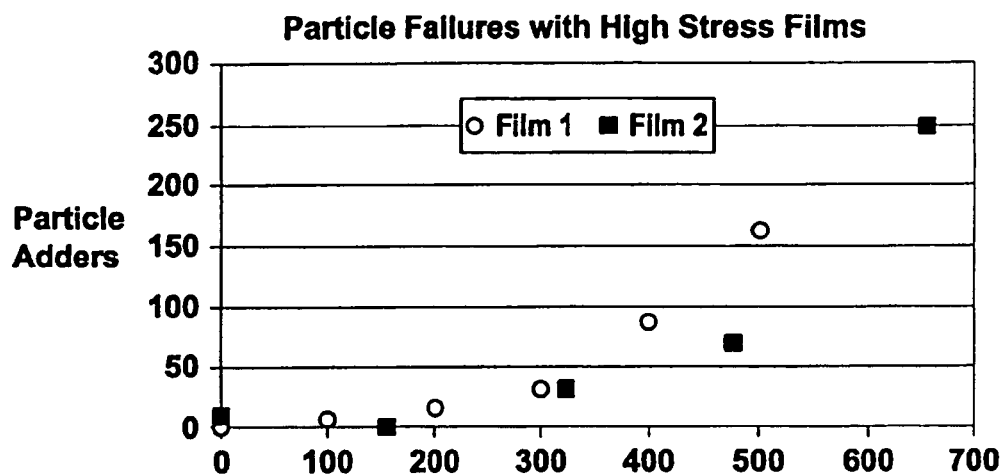
FIG. 5 is a graphical representation depicting conventional on-wafer particle performance for two types of film etched in a sputter chamber without using periodic sputtering of a Ti adhesion layer.
Figure 6:
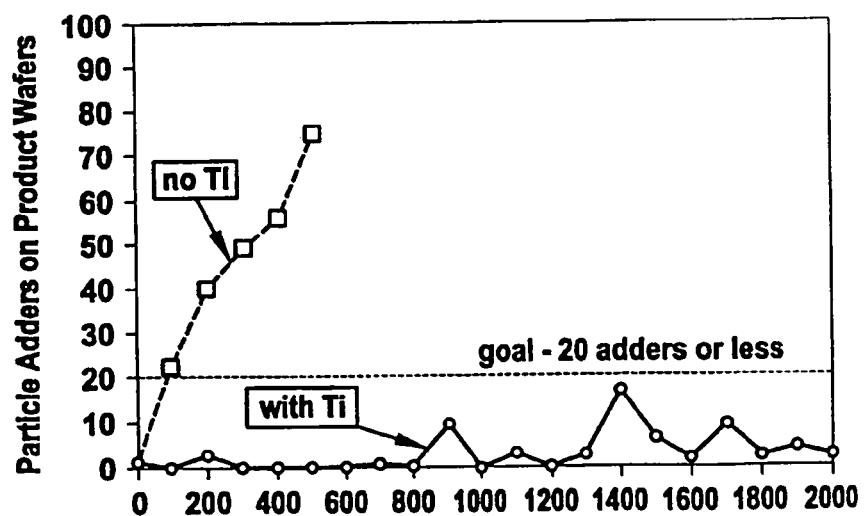
FIG. 6 is a graphical representation depicting particle performance with and without the use of periodic sputtering of Ti wafer.

Referring to FIGS. 5 and 6, FIG. 5 shows the results of two separate tests in which several hundred product wafers were continuously processed by sputtering of a typical amount of material per wafer (e.g. 100–200 Angstrom). The sputter etch module was assembled with freshly cleaned set of shields at wafer count zero. On-wafer particle counts sized 0.2 micron or larger were periodically monitored. Both films etched are representative for high stress poorly adhering films. As is shown, the particle performance illustrated for these two experiments is not acceptable for the production of reliable semiconductor devices. FIG. 6 shows the dramatic improvements of the present invention. FIG. 6 shows a comparison of two tests sputter etching identical films. One test shows the results of conventional processing whereby a Ti target wafer was not sputtered. However, in the second test, in accordance with the invention, a Ti target wafer was sputter etched periodically in accordance with flow chart shown in FIG. 4. As is shown, by sputtering the Ti target wafer in accordance with the invention, over approximately ten times improvement in the number of wafers can be processed with acceptable on-wafer particle performance (<20 adders in this example).

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of cleaning a semiconductor substrate comprising:
   providing a first target wafer within a processing chamber;
   coating all interior surfaces within said processing chamber with a first adhesion film of a material of said first target wafer;
   removing said first target wafer;
   providing at least one semiconductor substrate within said processing chamber;

cleaning a surface of said at least one semiconductor substrate whereby removed matter from said semiconductor substrate adhere to said first adhesion film on said interior surfaces within said processing chamber to form a continuous film of said removed matter.

2. The method of claim 1 wherein said first target wafer comprises a material selected from the group consisting of Ti, Al, Ta, and Ni.

3. The method of claim 1 wherein said first target wafer comprises a solid, single material having a sufficient sticking coefficient for adherence of subsequently removed materials in order to promote said continuous film growth and improve adhesion of said film.

4. The method of claim 1 wherein said first target wafer comprises a wafer coated with a material having a sufficient sticking coefficient for adherence of subsequently removed materials in order to promote said continuous film growth and improve adhesion of said film.

5. The method of claim 1 wherein said first target wafer has a thickness ranging from about 0.5 mm to about 10 mm.

6. The method of claim 1 further including the steps of:
processing said first target wafer within said processing chamber such that said material of said first target wafer is removed from said first target wafer; and
said removed material being directed at and adhering to all said interior surfaces within said processing chamber to form said first adhesion film.

7. The method of claim 6 wherein said first target wafer is processed by sputtering or reactive ion etching.

8. The method of claim 6 wherein about 10% to about 35% of said removed material of said first target wafer adheres to all said interior surfaces to form said first adhesion film.

9. The method of claim 1 wherein said first adhesion film has a thickness ranging from about 50 Å to about 4,000 Å.

10. The method of claim 1 further including providing a plurality of semiconductor substrates within said processing chamber for cleaning surfaces thereof whereby removed matter from said plurality of semiconductor substrates adhere to said first adhesion film.

11. The method of claim 1 further including the steps of:
removing said cleaned at least one semiconductor substrate;
providing a second target wafer within said processing chamber;
coating said continuous film of said removed matter with a second adhesion film of a material of said second target wafer;
removing said second target wafer;
providing at least another semiconductor substrate within said processing chamber; and
cleaning a surface of said at least another semiconductor substrate whereby removed matter from said another semiconductor substrate adhere to said second adhesion film to form a second continuous film of removed matter.

12. The method of claim 11 further including repeating said steps a plurality of times for forming a plurality of adhesion films and continuous films of removed matter for cleaning a plurality of semiconductor substrates.

13. The method of claim 11 wherein said second target wafer comprises said first target wafer.

14. The method of claim 11 wherein said second target wafer comprises a new target wafer.

15. A method of cleaning a semiconductor substrate comprising:
providing a semiconductor processing chamber having a pedestal;
positioning a target wafer on said pedestal;
etching said target wafer such that a material of said target wafer is removed from said target wafer;
coating all interior surfaces within said processing chamber with an adhesion film of said material having a thickness ranging from about 50 Å to about 4,000 Å;
removing said target wafer;
positioning a plurality of semiconductor substrates on said pedestal within said processing chamber;
cleaning surfaces of said plurality of semiconductor substrates whereby matter removed from said plurality of semiconductor substrates are directed at and adhere to said adhesion film to form a continuous film of said removed matter.

16. The method of claim 15 wherein said first target wafer comprises a material selected from the group consisting of Ti, Al, Ta, and Ni.

17. The method of claim 15 wherein about 10% to about 35% of said removed material of said target wafer adheres to all said interior surfaces to form said adhesion film.

18. The method of claim 15 wherein said matter removed from said plurality of semiconductor substrates is selected from the group consisting of residues, particles, contaminants and molecular fragments.

19. The method of claim 15 further including repeating said steps a plurality of times for forming a plurality of adhesion films and a plurality of continuous films of removed matter for cleaning said plurality of semiconductor substrates.

* * * * *